US007188226B2

(12) United States Patent
de Brebisson et al.

(10) Patent No.: US 7,188,226 B2
(45) Date of Patent: Mar. 6, 2007

(54) DEFECTIVE DATA SITE INFORMATION STORAGE

(75) Inventors: Cyrille de Brebisson, Boise, ID (US); Robin Alexis Takasugi, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 435 days.

(21) Appl. No.: 10/689,143

(22) Filed: Oct. 20, 2003

(65) Prior Publication Data

US 2005/0097393 A1 May 5, 2005

(51) Int. Cl.
*G06F 12/00* (2006.01)
*G06F 11/00* (2006.01)
*G06F 17/30* (2006.01)

(52) U.S. Cl. ....................... 711/170; 711/103; 711/173; 711/202; 714/52

(58) Field of Classification Search ................ 707/206; 711/103, 170, 202, 173; 714/52
See application file for complete search history.

(56) References Cited

U.S. PATENT DOCUMENTS 5,539,697 A 7/1996 Kim et al.
5,844,911 A 12/1998 Schadegg et al.
5,991,699 A * 11/1999 Kulkarni et al. .............. 702/83
6,178,549 B1 1/2001 Lin et al.
6,192,487 B1 2/2001 Douceur
6,212,647 B1 4/2001 Sims, III et al.
6,222,768 B1 4/2001 Hollmer et al.
6,223,303 B1 * 4/2001 Billings et al. ................ 714/8
6,256,756 B1 7/2001 Faulk, Jr.
6,266,677 B1 7/2001 Rodgers et al.
6,266,791 B1 7/2001 Taugher et al.
6,396,741 B1 5/2002 Bloom et al.
6,427,186 B1 7/2002 Lin et al.
2004/0184315 A1 * 9/2004 Hidaka ....................... 365/171

* cited by examiner

*Primary Examiner*—Mano Padmanabhan
*Assistant Examiner*—Mehdi Namazi

(57) ABSTRACT

A method of storing defective data site information for a storage device according to a particular embodiment of the invention includes determining a first defective data site associated with the storage device, determining a second defective data site associated with the storage device, determining a spacing value that represents spacing between the first defective data site and the second defective data site, and storing the spacing value. Apparatus and method aspects according to other embodiments of the invention also are disclosed.

13 Claims, 8 Drawing Sheets

DETERMINE FIRST DEFECTIVE DATA SITE — 240

DETERMINE SECOND DEFECTIVE DATA SITE — 242

DETERMINE SPACING VALUE — 240

STORE SPACING VALUE — 246

DEFECTIVE DATA SITE INFORMATION STORAGE

BACKGROUND OF THE INVENTION

Many short-term and long-term storage devices have bad sectors or otherwise unusable areas. MRAM (magnetic random access memory), flash memory, and atomic resolution storage (ARS) devices, for example, often include such defects. Typical bulk storage media, such as magnetic and optical disks, for example, also often include defects, such as inconsistencies in magnetic or optical coatings or other surface anomalies. In all cases, such unusable areas make portions of such media or other storage devices unsuitable for data storage. Nevertheless, it is desirable to use such media or devices for storage even though they contain defects. The defect areas are generally relatively small compared to the total storage area. Moreover, such defects may develop or first be detected only after normal use of the media or device has begun.

MRAM is a non-volatile memory useable for short-term and long-term data storage. MRAM is generally considered to have lower power consumption than short-term memory such as DRAM, SRAM and flash memory, and generally can perform read and write operations much faster (by orders of magnitude) than conventional long-term storage devices such as hard drives. In addition, MRAM is more compact and consumes less power than hard drives. MRAM is also useable for embedded applications such as extremely fast processors and network appliances. Use of MRAM thus provides various advantages in certain situations and environments.

In the case of bulk storage media, traditional schemes for defect management have relied on using a portion of the media as a defect management area in order to present a media that, although including defective areas, appears as if it were defect-free. Accordingly, upon a manufacturer's formatting of the media for subsequent use in data storage, an analysis of the storage areas occurs and defective areas are marked as unusable. A list of the defective areas is stored on the media. A defect management system reads the list from the media and uses it to map defective areas to spare areas. In order to provide media that includes a particular amount of available user storage area, logical addresses of the user data areas are "slipped" into the defect management area so as to omit the physical addresses of the defective areas and, thus, present seemingly defect-free logical media.

As defective areas may develop or be discovered during actual use of bulk storage media, there have been methods of providing redirection for or replacement of such defective areas to available sparing areas. Defective areas discovered after bulk storage media is formatted, for example, typically are called "grown" defects. Systems operate to remap or redirect the logical address associated with an area determined to be defective to the logical address of a sparing area. Therefore, a manufacturer's initial formatting of the media can include establishing predefined user data areas and corresponding predefined sparing areas for redirection or remapping of grown defects. For example, with magneto-optical (MO) disks, a MO drive recognizes the particular media and uses both the predetermined user data areas and predetermined sparing areas (defect redirection or remapping areas). Such sparing areas have been interspersed with the user data areas throughout the media at various intervals, thus establishing zones within the media wherein an amount of user data area and its corresponding sparing area are established. Defect management tables have been provided to allow the drive to properly read and write user data within these zones without encountering a defective area. Such management tables store a list of used sparing areas and are used to determine sparing areas available for remapping. Defective areas are mapped out by reassigning their logical addresses to the sparing areas.

With "linear replacement" defect mapping, a defective sector is simply mapped to a spare sector. Access times for bulk media with linear replacement mapping however, can increase undesirably. To reduce the access latency of linear replacement mapping, "sector slipping" is also used. With sector slipping, the assignment of a logical sector number to a physical sector number skips over the defective sector, and all of the logical sector numbers are "slipped" by one. Sector slipping generally is not considered to lend itself well to use with grown defects, because of the large amount of remapping that must occur.

SUMMARY OF THE INVENTION

A method of storing defective data site information for a storage device according to a particular embodiment of the invention includes determining a first defective data site associated with the storage device, determining a second defective data site associated with the storage device, determining a spacing value that represents spacing between the first defective data site and the second defective data site, and storing the spacing value. Apparatus and method aspects according to other embodiments of the invention also are disclosed.

BRIEF DESCRIPTION OF THE DRAWINGS

The accompanying drawings illustrate embodiments of the present invention and together with the description serve to explain certain principles of the invention. Other embodiments of the present invention will be readily appreciated with reference to the drawings and the description, in which like reference numerals designate like parts and in which.

DESCRIPTION OF PREFERRED EMBODIMENTS

Embodiments of the invention apply to a wide variety of short-term and long-term storage devices and media (collectively herein, "devices", for ease of reference). MRAM, flash memory, ARS devices, hard drives, bulk media, and other storage devices are among the possibilities for use according to embodiments of the invention. Although particular embodiments of the invention are described herein with respect to specific ones of these devices, such as MRAM, such embodiments are not necessarily limited to use with the specific devices described.

As mentioned above, many short-term and long-term storage devices have bad sectors or other defective data sites (collectively herein, "sectors", for ease of reference). It is desirable, according to embodiments of the invention, for firmware to hide the bad sectors from an associated host computer, processing device or other device. Accordingly, sectors addressed by the host (logical sectors) are assigned only to good sectors on the media or other device (physical sectors), instead of to bad physical sectors. One way to perform this association is to associate a logical sector "n" with the "nth" good physical sector. Slip sparing information is used as a table lookup that associates the good physical sector numbers with the logical sector numbers.

Figure 1:
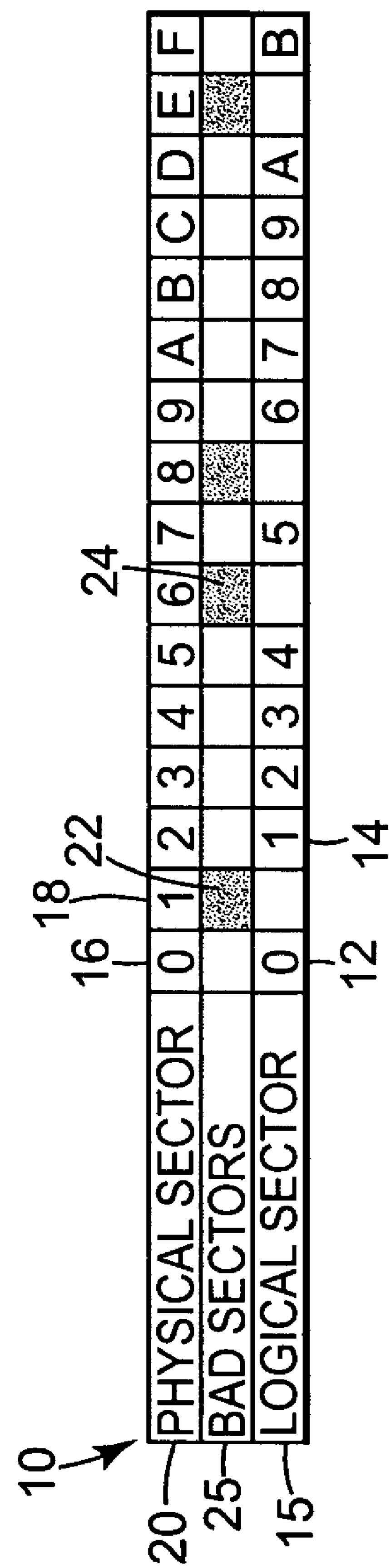
FIG. 1 shows an association scheme according to an embodiment of the invention.

With sparing association scheme 10 (FIG. 1) according to an embodiment of the invention, data storage takes as an input one of the logical sectors 12, 14, etc. represented in row 15, along with associated data to be stored. The logical sectors of row 15 are associated with the correct physical sectors 16, 18, etc. of row 20, advantageously in a time-effective and efficient manner. The associated data then is stored in (or read from) the correct physical sector. Bad sectors, represented at e.g. 22 and 24 of row 25, are avoided. One or more tables, lists, or other data structures or arrangements associated with scheme 10 are stored on the media, memory or other device with which scheme 10 is used, according to embodiments of the invention. Scheme 10, as stored, provides the physical sector associated with a given logical sector.

Figure 2:
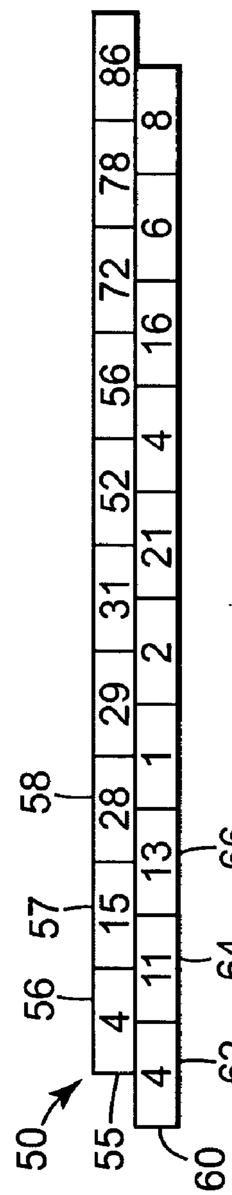
FIGS. 2–3 show lookup tables according to embodiments of the invention.

One table or data structure according to an embodiment of the invention is illustrated at 50 in FIG. 2. Row 55 of table 50 provides numerical or other identifiers 56, 57, 58, etc. of bad physical sectors, and row 60 provides distances or spacings 62, 64, 66, etc., between adjacent or successive bad physical sectors. In other words, row 60 contains difference values taken between successive bad sectors, which are illustrated as next to each other in row 55, and the necessity of storing bad physical sector numbers themselves is eliminated. Thus, for example, a first bad sector 56 is identified as sector number 4 in table 50. A second bad sector 57 is identified as sector number 15, and a third bad sector 58 is identified as sector number 28. The spacing or difference between the two bad sectors identified at 56 and 57 is stored at 64. Here, that difference is 11. The difference between the two bad sector identifiers 57 and 58, namely 13, is stored at 66. The difference between the bad sector identified at 56 and a start point, assumed for illustration purposes to be zero, is 4 and is stored at 62. The difference values shown in row 60 are stored, e.g. in the form of a list or one-dimensional array, and used to indicate positions of bad physical sectors and/or to execute a slip-sparing association scheme according to embodiments of the invention. According to certain embodiments of the invention, only row 60 is stored.

Figure 3:
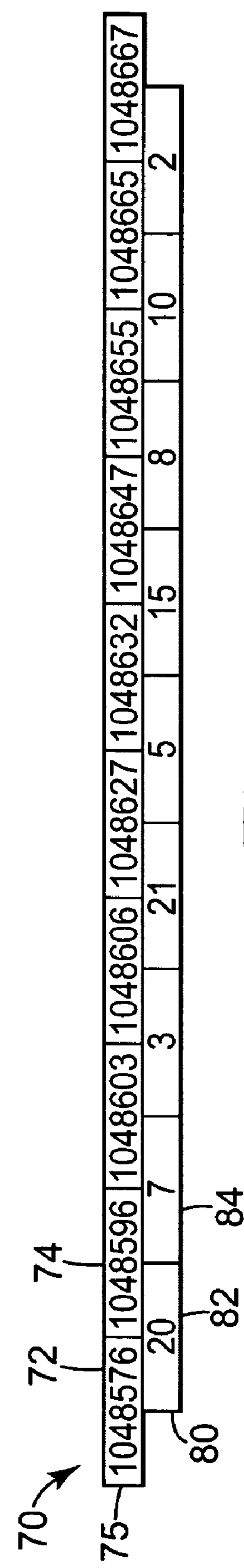

FIG. 3 shows table 70, in which row 75 provides a larger, more realistic bad sector numbers 72, 74, etc., in the case of e.g. MRAM. Row 80 stores difference values 82, 84, etc. between successive bad sector numbers. With the FIG. 3 embodiment, the difference values of row 80 that are stored are far smaller than the sector numbers of row 75. An initial difference value stored in row 80 is the difference between a "base" or a predetermined physical sector number (e.g. sector number 0) and the first sector number stored in row 75, according to one embodiment. Subsequent physical sector numbers are optionally determined computationally based on the difference values in row 80. Because storage of the difference values shown in row 80 consumes less space than storage of the sector number values shown in row 75, storage space is reduced. Additionally, according to embodiments of the invention, only e.g. row 80 of table 70 is stored, instead of row 75 or both rows 75 and 80, further reducing storage space.

FIGS. 2–3 illustrate association schemes for sectors that are physically or conceptually laid out "linearly," as with MRAM and other types of memory devices according to embodiments of the invention. As mentioned above, certain aspects of sector assignment according to embodiments of the invention also apply to a wide variety of other long-term and short-term storage devices, including without limitation flash memory, atomic resolution storage (ARS) devices, hard drives, and bulk storage media such as magnetic and optical disks.

Figure 4:
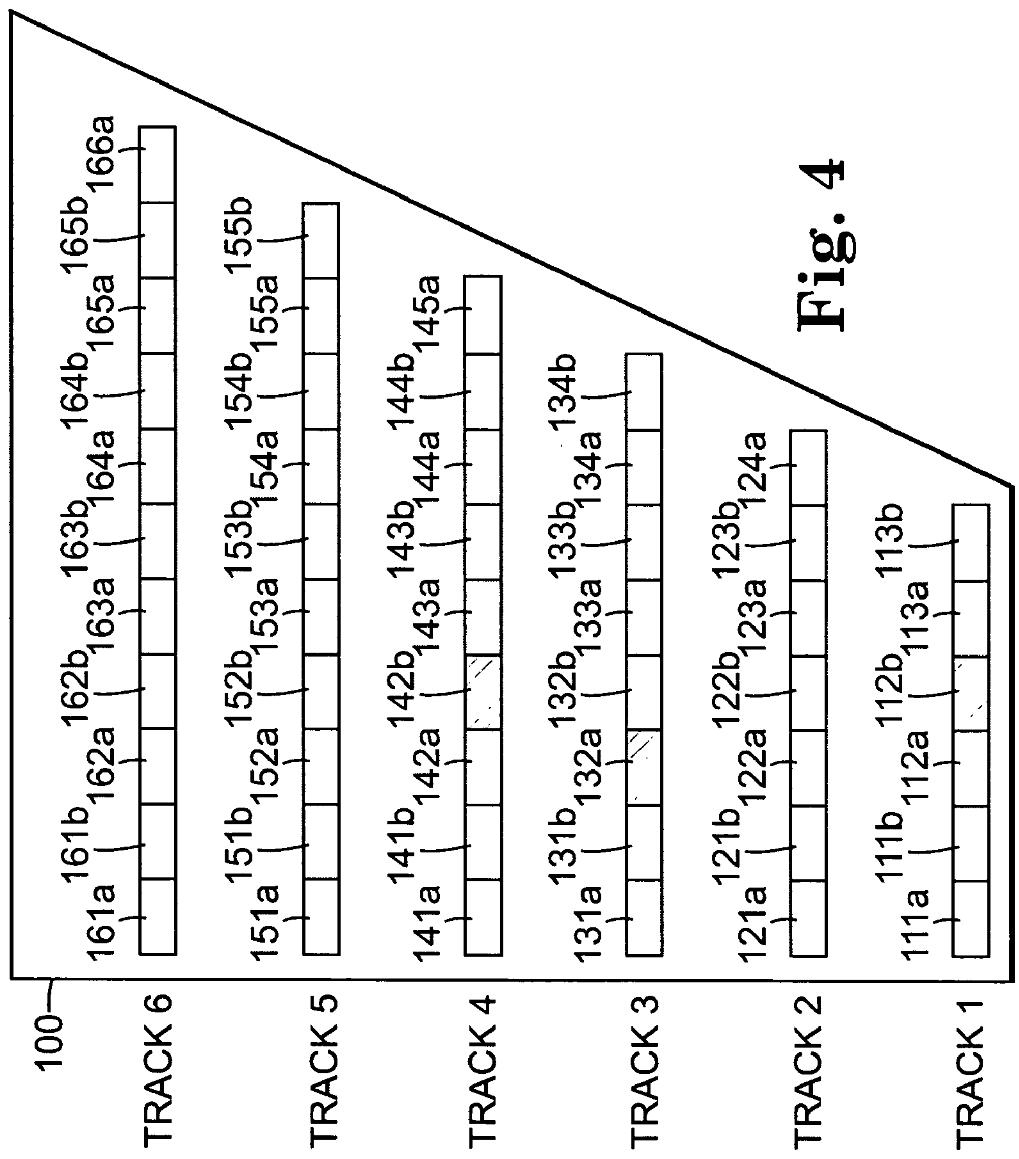
FIG. 4 shows disk-type sector arrangement, according to an embodiment of the invention.

FIG. 4, for example, illustrates storage device 100 useable according to embodiments of the invention. Device 100 is a disk-type media having a circular shape and defines tracks 1 through 6, as shown. Tracks of device 100 are progressively greater in length because the tracks on this particular disk are concentric rings that are larger the closer they are disposed to the circumferential edge of the disk. The tracks of device 100 have sectors defined therein, i.e., sectors 111*a*–113*b* for track 1, sectors 121*a*–124*a* for track 2, sectors 131*a*–134*b* for track 3, sectors 141*a*–145*a* for track 4, sectors 151*a*–155*b* for track 5, and sectors 161*a*–166*a* for track 6. Each sector represents e.g. a 512 byte block or set of data, according to one particular embodiment.

Sectors 112*b*, 132*a*, and 142*b* in FIG. 4 are defective. Defective sectors are optionally determined upon format, e.g. the manufacturer's format or primary or low-level format. Sectors 112*b*, 132*a*, and 142*b* thus are omitted from available logical addresses and are therefore considered "slipped" to non-defective sectors. If these defects are detected during a primary format of the media, the physical addresses for these sectors are omitted in the logical address table for the media. For example, although sector 132*a* is the third physical sector of track 3, sector 132*b* would be logically identified as the third sector. The logical address is slipped one address space to omit the defective sector. Thus, although device 100 might be able to physically contain n sectors (good and bad), device 100 will be seen by the host as having only m sectors (m<=n), all good. Each logical sector is assigned to a good physical sector, according to the defect table or list for the media or other device, e.g. in accordance with tables 50, 70 of FIGS. 2–3. Tables according to embodiments of the invention optionally store additional parameters or features to address the circular shape and corresponding track disposition of disk-type media. For example, cylinder numbers, head numbers, and data sector numbers are optionally all stored.

Figure 5:
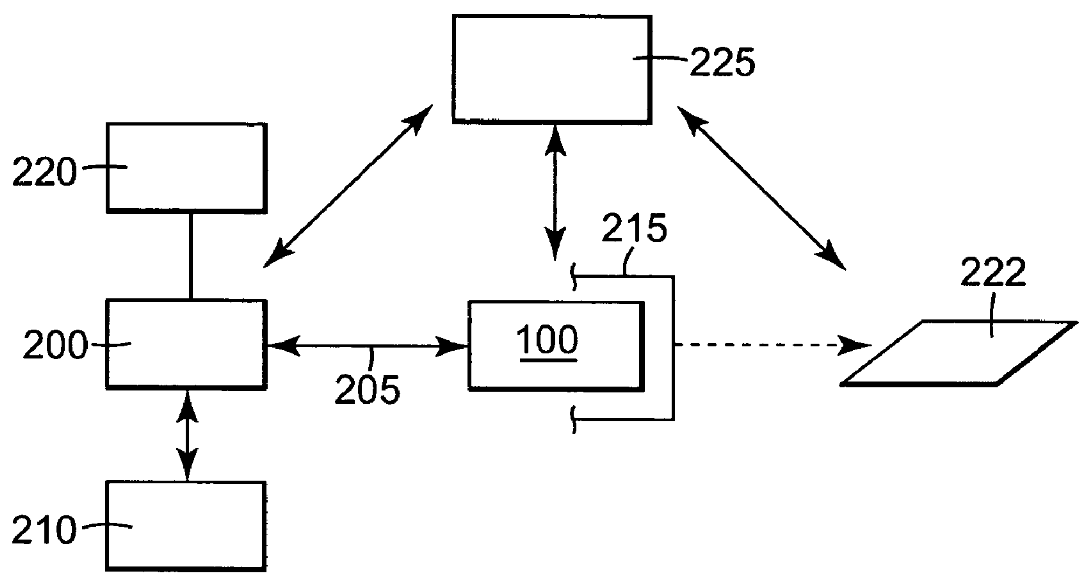
FIG. 5 is a schematic diagram showing hardware aspects according to an embodiment of the invention.

Turning to FIG. 5, controller 200 is operably coupled with device 100 as indicated by arrow 205. Device 100 represents any of the long-term storage, short-term storage, or other devices referenced previously herein, for example. At first boot-up, controller 200 tests all or a desired number of sectors of device 100 and creates one or more association schemes like that illustrated at 10 in FIG. 1. Scheme 10 is represented in e.g. a lookup table or other data structure, as at 50 or 70 in FIGS. 2–3. The lookup table includes physical sector entries or difference entries, for example, and/or associated logical sector entries. The creation of the association scheme(s) and table(s) optionally is a one-time event. One or more tables or other data structures or arrangements based on the scheme, e.g. corresponding to rows 60 and 80 in FIGS. 2–3, are stored on device 100, according to embodiments of the invention. Additionally, or alternatively, such table(s) or structures also optionally are stored on other media or in another location or device, such as in additional or supplemental memory 210, a mass media controller memory, etc. Storage space is decreased, and access times are improved. Because the distribution of bad sectors in device 100 is random or random-like, the values of e.g. row 80 or other data structure optionally are not stored using a fixed number of bits. By assuming locality of error, that is, assuming that when one sector is bad, one or more adjacent sectors also are bad, for a 0.5 GB device, the size of the associated stored table varies between about 25 KB (about 5% errors) and about 50 KB (about 15% errors).

The testing and storing performed using controller 200 optionally occur as part of a factory testing protocol, and/or to build statistical data for a first or other production series, for example. According to specific examples, controller 200 is a "testing" controller module that operably connects with each device 100 to test. Controller 200 optionally has a relatively large amount of RAM, allowing table building to occur quickly and efficiently. Device 100 and/or testing controller 200 optionally are included in a chip, card or package 215. Controller 200 optionally is an FPGA (Field Programmable Gate Array) or other form of hardware that does not have a fixed circuit, allowing a programmer to modify the circuit. Controller 200 and/or device 100 optionally are connected by a serial port or other connection to a test computer or other device 220, which contains additional memory and/or processing power. Controller 200 performs an initialization and test routine and provides statistics on package quality, for example, in addition to developing one or more schemes/tables, according to embodiments of the invention. Sparing tables according to embodiments of the invention avoid or designate as "bad" those sectors having a large number of recovered errors. The tested package 215 optionally is mounted on a PCB or other platform 222, according to certain embodiments.

Device 100, controller 200, chip, card or package 215, and/or platform 222 are, optionally, physically and/or operably couplable with host 225. Host 225 according to embodiments of the invention includes one or more desktop or laptop computers, PDA's, processors, digital cameras, cellular telephones, calculators, appliances, and/or a wide variety of other devices, for example.

Thus, according to embodiments of the invention, storage device 100 is operably couplable to host 225 and has data sites for storing data. The data sites comprise the defective data sites 22, 24 (FIG. 1) and/or 112*b*, 132*a*, 142*b* (FIG. 4). Storage device 100 maintains defect information reportable to host 225, the defect information comprising differences in location between defective data sites of storage device 100. The data sites optionally comprise sectors, and the differences in location between defective data sites optionally are differences in sector numbers. Storage device 100 optionally comprises MRAM, a hard drive, or the other examples referenced herein, and optionally is in combination with a testing controller 200, which is operably connectable to storage device 100 for discovering the defective data sites. Host 225, storage device 100 and/or the other elements described herein optionally are considered as all or part of an electronic system, according to embodiments of the invention.

Figure 6:
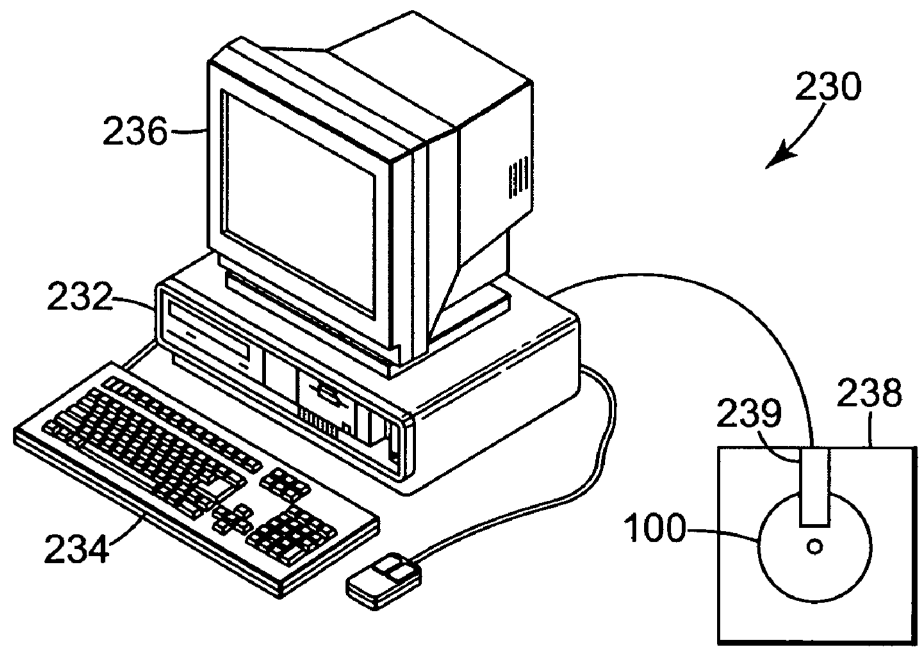
FIG. 6 is a perspective view of an electronic system according to an embodiment of the invention.

One specific host and storage device arrangement according to an embodiment of the invention is shown in FIG. 6. System 230 includes a processor-based system 232, in the form of a personal computer, acting as a host. System 232 has input device 234, e.g. a keyboard, and output device 236, e.g. a video display. System 230 according to this particular example includes bulk media drive unit 238 having storage device 100 disposed therein, e.g. in the case where device 100 is a hard drive. Drive unit 238 includes head assembly 239 adapted to exchange information between device 100 and processor based system 232. Other storage devices and/or bulk storage media according to embodiments of the invention are described previously herein, and can take a wide variety of form factors, such as chips or chip modules, compact flash-type cards, PC cards and other cards (optionally including one or more associated test or other controllers 220, as referenced herein), floppy disks, etc.

Figure 7:
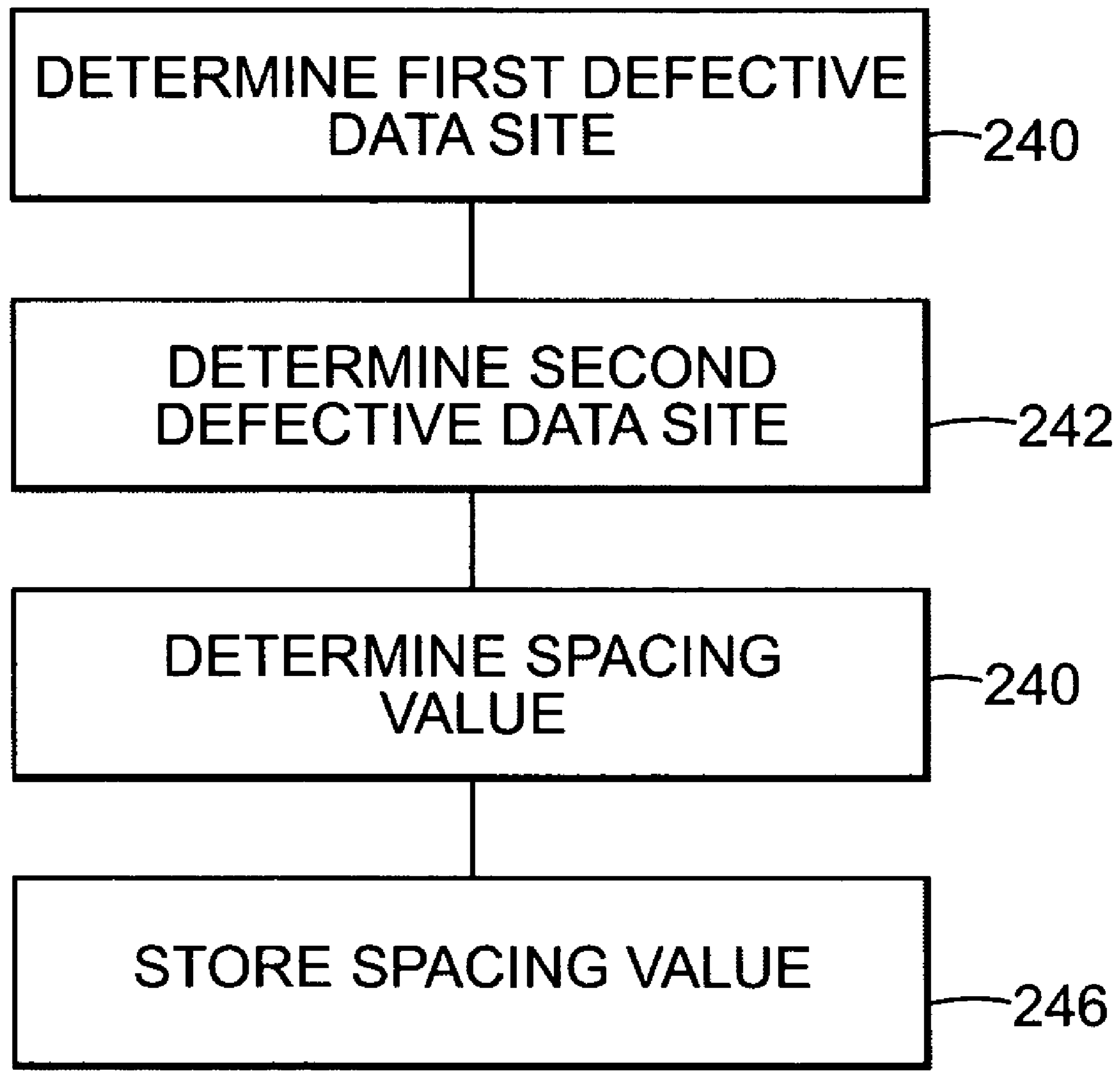
FIG. 7 is a flow diagram showing a method according to an embodiment of the invention.

As illustrated in FIG. 7, a method of storing defective data site information for a storage device, such as storage device 100, comprises determining, at 240 and 242, a first defective data site associated with the storage device and a second defective data site associated with the storage device. The method determines, at 244, a spacing value that represents spacing between the first defective data site and the second defective data site. The method stores the spacing value at 246. Determining a spacing value optionally comprises determining a difference value, for example one of the difference values of rows 60 and 80 in FIGS. 2 and 3. The first defective data site has a first data site number and the second defective data site has a second data site number, as e.g. in rows 55 and 75 of FIGS. 2–3, and determining a spacing value comprises determining a difference between the first data site number and the second data site number. Storing the spacing value comprises storing the spacing value in or on the storage device.

Figure 8:
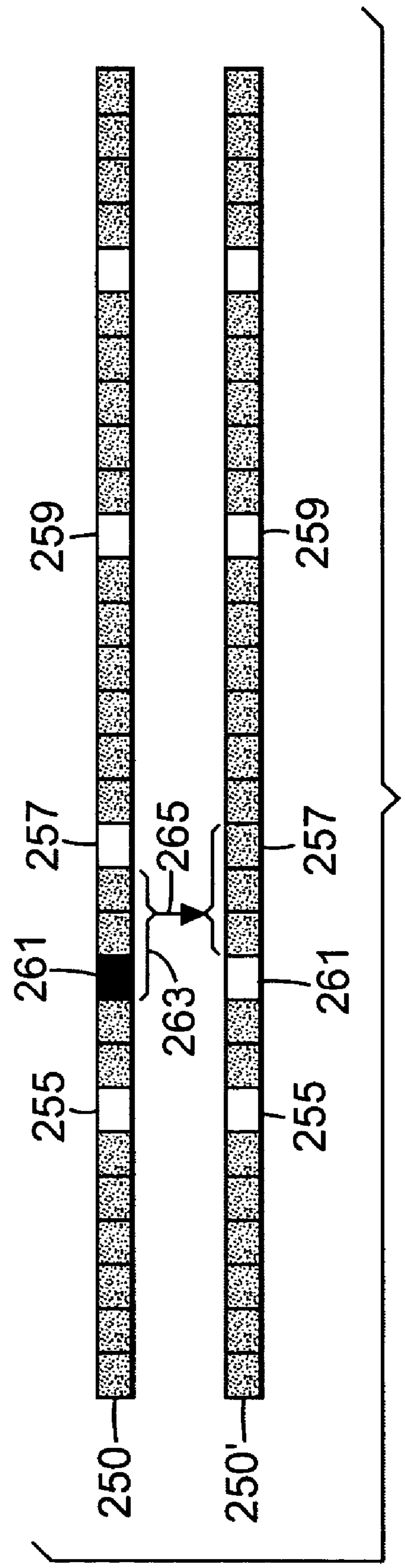
FIGS. 8–10 show data sites on storage devices, according to embodiments of the invention.
Figure 9:
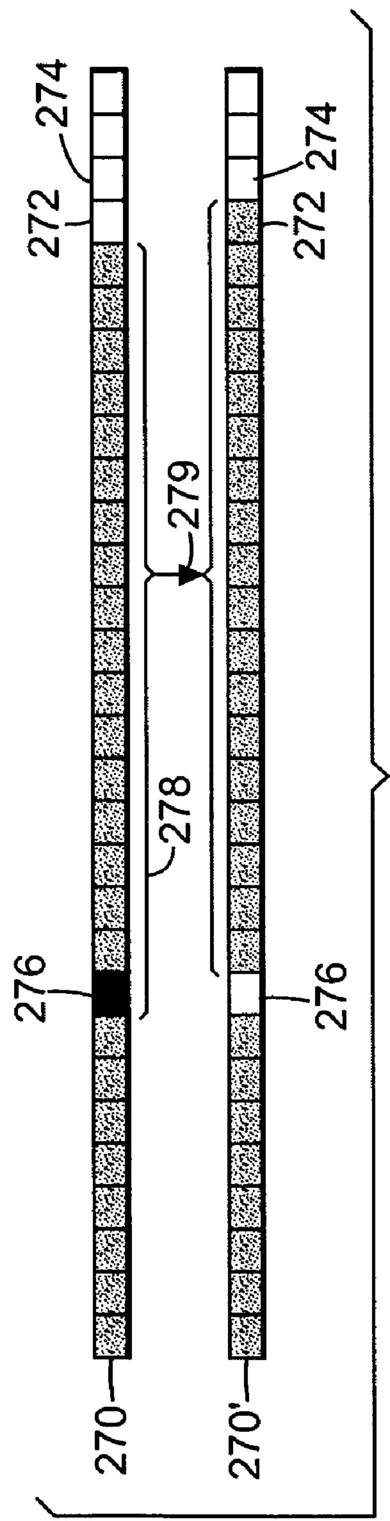
Figure 10:
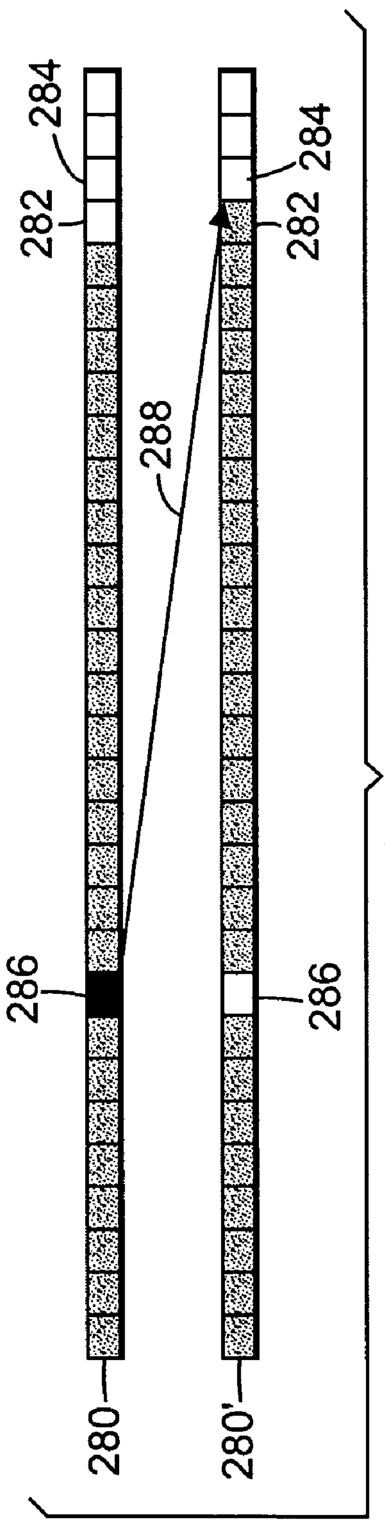

With reference to FIGS. 8–10, according to embodiments of the invention, a certain number of good sectors are designated as spare sectors and are distributed generally evenly across the device or media. If a new bad sector, e.g. a grown defect, is detected in a certain area, it is then possible to remap or "shift" only the sectors between the bad sector and the next unused good sector, i.e. the next available spare. Alternatively, it is possible to remap or shift only the sectors between the bad sector and the previous spare sector. The new bad sector is recorded, e.g. in the manner described with respect to FIGS. 2–3.

FIG. 8 illustrates one sector remapping embodiment, according to which device 250 includes generally evenly distributed spare sectors 255, 257, 259, etc. Sector 261 is a bad sector, representing a grown defect, for example. According to this embodiment, only set 263 of three sectors needs to be "moved," or remapped, as indicated by arrow 265. After remapping, as illustrated at 250', bad sector 261 is left unused. Set 263 is shifted one sector to the right, as viewed in the figure, and spare sector 257 is now used for storage in place of bad sector 261. A list of spare sectors is updated, and the slip sparing process in use is kept intact.

Thus, one example of a storage system according to embodiments of the invention comprises storage device 250, which includes a plurality of data sites. The data sites include spare data sites 255, 257, 259 distributed generally evenly throughout at least a portion of storage device 250. An access device, such as controller 200 or host 225 (FIG. 5), accesses storage device 250, the access device being adapted to avoid a grown defect 261 in the storage device by shifting data, stored in data sites 263 disposed between grown defect 261 and spare data site 257, toward spare data site 257. The spare data sites each optionally comprise a sector.

FIGS. 9–10 illustrate other remapping embodiments. In FIG. 9, device 270 includes spare sectors 272, 274, etc., all grouped at the end of device 270, or arranged in groups at the end of respective portions of device 270, instead of being dispersed throughout device 270. Discovery of bad sector 276 causes set 278 to be remapped, as indicated by arrow 279. Because of the distance between bad sector 276 and first available spare 272, set 278 to be remapped includes 18 sectors. After remapping, as illustrated at 270', bad sector 276 is left unused, and spare 272 is used instead. FIG. 9 represents a "shift-based" process, in which the data in the bad sector and are copied one block to the right, and the original slip sparing process is still used.

In FIG. 10, device 280 includes spare sectors 282, 284, etc., all at the end as in FIG. 9. Discovery of bad sector 286 causes just that sector to be remapped, as illustrated by arrow 288. After remapping, as illustrated at 280', bad sector 286 is left unused, and spare 282 is used instead. FIG. 10 represents a "reallocation-based" process, in which just the bad data is relocated to the back of the device. Another level of slip sparing is needed, in addition to the original slip sparing process, and complexity and access latency are increased. With both FIGS. 9–10, a risk inherent in relocating all bad sectors to one "spares" area is that the spares area itself may have its own cluster of defects. The FIG. 8 embodiment thus provides certain advantages over the embodiments of FIGS. 9–10, in certain situations.

Figure 11:
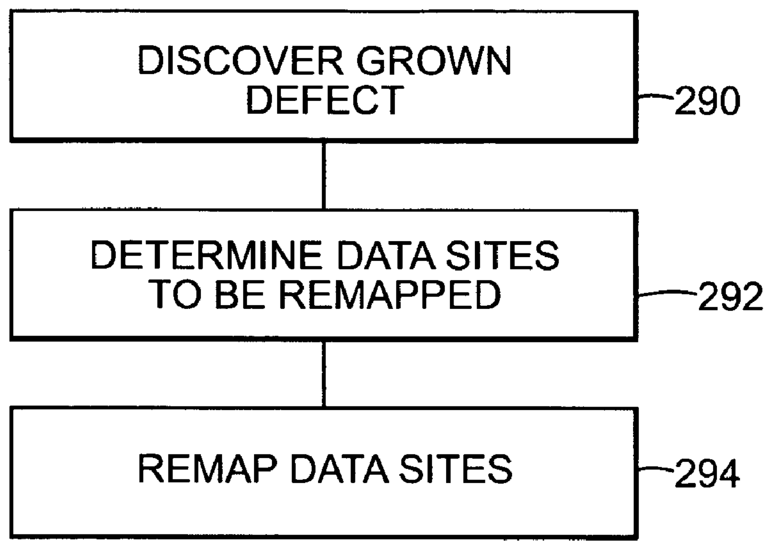
FIGS. 11–12 are flow diagrams showing methods according to embodiments of the invention.

With reference to FIG. 11 in association with FIGS. 8–10, a method of accommodating a defect in a storage device includes discovering a defect at 290, the defect being in a storage device having spare data sites at generally regular intervals throughout at least a portion of the storage device. The method further includes determining a plurality of data sites to be remapped, at 292, the plurality of data sites to be remapped being disposed between the defect and an adjacent one of the spare data sites, and remapping the plurality of data sites to avoid the defect, at 294. The remapping optionally includes evenly shifting data associated with each of the plurality of data sites toward the adjacent spare data site. The adjacent spare data site optionally is a data site nearest the defect.

According to additional aspects of the invention, a lookup table for a slip sparing process stores differences between logical sector numbers and physical sector numbers, broadly speaking, and not necessarily the physical sector numbers of bad sectors or differences between successive bad physical sector numbers. In other words, a table according to this embodiment stores the number of bad sectors located before the physical sector used to store the logical sector. Embodiments of the invention additionally use a small table (one entry per 1024 logical sectors, for example) containing adjustment numbers, as will be explained.

A small table (or "adjustment table") according to this embodiment has only one adjustment-number entry per a predetermined number of logical sectors, e.g. per 1024 logical sectors. The nth entry of the table contains the number of bad sectors between the beginning of the device and the physical sector used to store logical sector number n*1024 (or other predetermined number). A second table, called a differential table, has one entry per logical sector. The $n^{th}$ entry contains the number of bad sectors between the physical sector associated with (logical sector n)-(n mod 1024), and the physical sector associated with logical sector n.

The following example uses simulated data to show logical sector numbers, their associated physical sector numbers, adjustment table entries and differential table entries according to this embodiment. For each line of the table, the physical sector number is equal to the entry in the adjustment table plus the entry in the differential table plus the logical sector number. The logical sector number serves as an index and is not stored per se. The logical sector number is determined by multiplying the adjustment table entry number by 1024, according to this example.

TABLE 1

| Logical Sector # (Lsector) | Physical Sector # (Psector) | Adjustment Table | Differential Table |
|---|---|---|---|
| 141312 | 145214 | 3902* | 0 |
| 141313 | 145215 | | 0 |
| 141314 | 145216 | | 0 |
| 141315 | 145217 | | 0 |
| 141316 | 145218 | | 0 |
| 141317 | 145219 | | 0 |
| 141318 | 145220 | | 0 |
| 141319 | 145221 | | 0 |
| 141320 | 145222 | | 0 |
| 141321 | 145223 | | 0 |
| 141322 | 145225 | | 1 |
| 141323 | 145226 | | 1 |
| 141324 | 145227 | | 1 |
| 141325 | 145228 | | 1 |
| 141326 | 145229 | | 1 |
| 141327 | 145231 | | 2 |
| 141328 | 145232 | | 2 |
| 141329 | 145233 | | 2 |
| 141330 | 145234 | | 2 |
| 141331 | 145235 | | 2 |
| 141332 | 145236 | | 2 |
| 141333 | 145237 | | 2 |
| 141334 | 145238 | | 2 |
| 141335 | 145239 | | 2 |
| 141336 | 145240 | | 2 |
| 141337 | 145241 | | 2 |
| 141338 | 145242 | | 2 |
| 141339 | 145243 | | 2 |
| 141340 | 145244 | | 2 |
| 141341 | 145245 | | 2 |
| 141342 | 145246 | | 2 |
| 141343 | 145247 | | 2 |
| 141344 | 145248 | | 2 |
| 141345 | 145249 | | 2 |
| 141346 | 145250 | | 2 |
| 141347 | 145251 | | 2 |
| 141348 | 145252 | | 2 |
| 141349 | 145253 | | 2 |
| 141350 | 145254 | | 2 |
| 141351 | 145256 | | 3 |
| 141352 | 145257 | | 3 |
| 141353 | 145258 | | 3 |
| 141354 | 145259 | | 3 |
| 141355 | 145260 | | 3 |
| 141356 | 145261 | | 3 |
| 141357 | 145262 | | 3 |
| 141358 | 145263 | | 3 |
| 141359 | 145264 | | 3 |
| 141360 | 145265 | | 3 |
| 141361 | 145266 | | 3 |
| 141362 | 145267 | | 3 |

*(entry number 138 = 141312/1024)

Looking at the first row of Table 1, for example, the physical sector number (145214) is equal to the adjustment table entry (3902) plus the entry in the differential table (0) plus the logical sector number (141312). Looking at the eleventh row of Table 1, the physical sector number (145225) is equal to the corresponding adjustment table entry (3902) plus the entry in the differential table (1) plus the logical sector number (141322). Appropriate pointers or other indicators optionally are used to access and/or correlate adjustment and differential table entries and other parameters if desired. According to one embodiment, one possible function providing the physical sector number associated with a particular logical sector number is as follows:

```
Unsigned int LogicalToPhysical(unsigned int Lsector)
{
  int NumberOfBadToLsector= DifferentialTable[Lsector] +
  AdjustmentTable[Lsector/1024];
  int Psector= NumberOfBadToLsector + Lsector;
  return Psector;
}
```

For a 2 GB device, storing a table with just the physical sector numbers associated with the logical sector numbers consumes about 16 MB of storage (16,384 KB for table entries of 4 bytes). Embodiments of the invention as described above, on the other hand, consume only about 4.108 MB, for example, or about 4 times less memory. Each entry in the adjustment table consumes 4 bytes, and each entry in the differential table optionally is an unsigned character (instead of an unsigned integer) and therefore consumes only 1 byte. The size of the adjustment table for a 2 GB device is about 16 KB, and differential table size is about 4096 KB. Embodiments of the invention thus reduce the amount of memory needed for a spare lookup table, for example by about 4 times, without significant decrease in access speed.

Figure 12:
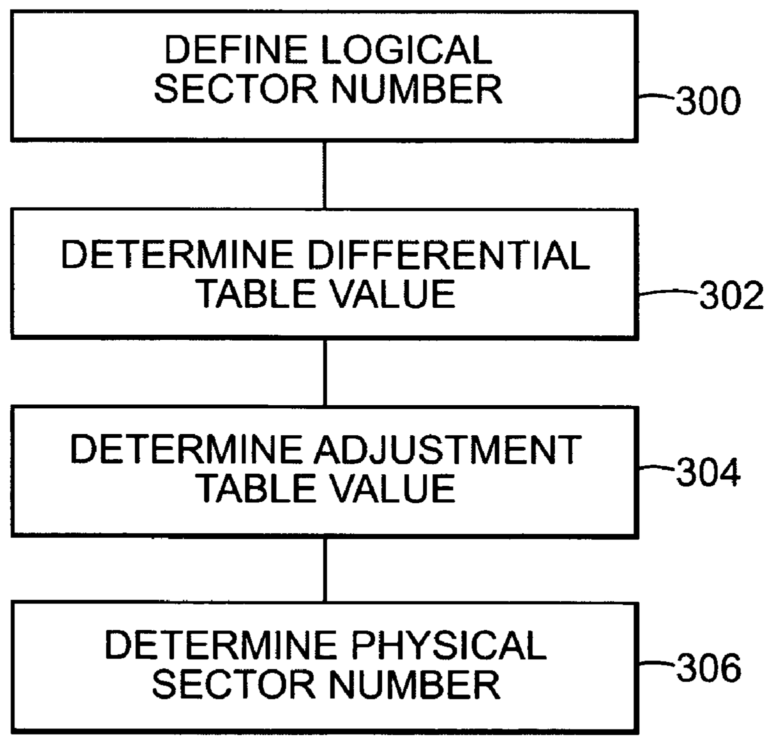

Thus, as illustrated in FIG. 12, a method of associating logical sectors with physical sectors of a storage device, according to an embodiment of the invention, includes defining a logical sector number, at 300, determining a differential table value based on the logical sector number, at 302, determining an adjustment table value based on the logical sector number, at 304, and determining a physical sector number by adding the differential table value and the adjustment table value to the logical sector number, at 306. At 304, according to one embodiment, a quotient is defined by dividing the logical sector number by a denominator, and using the quotient to obtain the adjustment table value. The differential table has one entry per logical sector, and the adjustment table has one entry per multiple logical sectors, the number of multiple logical sectors optionally being equal to the denominator.

Embodiments of the invention also include one or more computer-readable media having stored thereon a computer program that, when executed by a processor, causes defective data site information storage, accommodation of a defect in a storage device, association of logical sectors with physical sectors of a storage device, and/or the other features and capabilities described herein.

Although the present invention has been described with reference to certain embodiments, those skilled in the art will recognize that changes may be made in form and detail without departing from the spirit and scope of the invention. Additional aspects of the invention will be apparent to those of ordinary skill upon reading this disclosure.

What is claimed is:

1. A method of storing defective data site information for a storage device, the method comprising:

determining a first defective data site associated with the storage device;

determining a second defective data site associated with the storage device;

determining a spacing value that represents spacing between the first defective data site and the second defective data site, wherein determining the spacing value comprises determining a difference value; and storing the spacing value in or on the storage device.

2. A method of storing defective data site information for a storage device, the method comprising:

determining a first defective data site associated with the storage device, wherein the first defective data site has a first data site number;

determining a second defective data site associated with the storage device, wherein the second defective data site has a second data site number;

determining a spacing value that represents spacing between the first defective data site and the second defective data site, wherein determining a spacing value comprises determining a difference between the first data site number and the second data site number; and storing the spacing value.

3. A storage device operably couplable to a host and having a first sites for storing data, the data sites comprising a first defective data sites having a first data site number and a second defective data site having a second data site number, wherein the storage device maintains defect information reportable to the host, the defect information comprising a spacing value that represents spacing between the first defective data site and the second defective data sites of the storage device, wherein the spacing value comprises a difference between the first data site number and the second data site number.

4. The storage device of claim 3, wherein the data sites comprise sectors; further wherein the differences in location between defective data sites are differences in sector numbers.

5. The storage device of claim 3, wherein the storage device comprises MRAM.

6. The storage device of claim 3, wherein the storage device comprises a hard drive.

7. The storage device of claim 3, in combination with a testing controller operably connectable to the storage device for discovering the defective data sites.

8. A method of associating logical sectors with physical sectors of a storage device, the method comprising:

defining a logical sector number;

determining a differential table value based on the logical sector number;

determining an adjustment table value based on the logical sector number; and determining a physical sector number by adding the differential table value and the adjustment table value to the logical sector number.

9. The method of claim 8, wherein determining an adjustment table value comprises defining a quotient by dividing the logical sector number by a denominator, and using the quotient to obtain the adjustment table value.

10. The method of claim 8, wherein the differential table has one entry per logical sector; further wherein the adjustment table has one entry per multiple logical sectors.

11. The method of claim 10, wherein determining an adjustment table value comprises defining a quotient by dividing the logical sector number by a denominator and using the quotient to obtain the adjustment table value; further wherein the number of multiple logical sectors is equal to the denominator.

12. One or more computer-readable media having stored thereon a computer program that when executed by a processor, causes defective data site information storage according to the following method:

determining a first defective data site associated with the storage device;

determining a second defective data site associated with the storage device;

determining a spacing value that represents spacing between the first defective data site and the second defective data site; and storing the spacing value in or on the storage device.

13. One or more computer-readable media having stored thereon a computer program that, when executed by a processor, causes association of logical sectors with physical sectors of a storage device according to the following method:

defining a logical sector number;

determining a differential table value based on the logical sector number;

determining an adjustment table value based on the logical sector number; and determining a physical sector number by adding the differential table value and the adjustment table value to the logical sector number.

* * * * *

UNITED STATES PATENT AND TRADEMARK OFFICE

CERTIFICATE OF CORRECTION

PATENT NO. : 7,188,226 B2
APPLICATION NO. : 10/689143
DATED : March 6, 2007
INVENTOR(S) : Cyrille de Brebisson et al.

It is certified that error appears in the above-identified patent and that said Letters Patent is hereby corrected as shown below:

In column 7, line 9, after “sector and” insert -- all the sectors afterwards --.

In column 10, line 63, in Claim 12, delete “that” and insert -- that, --, therefor.

Signed and Sealed this

Seventeenth Day of February, 2009

JOHN DOLL
*Acting Director of the United States Patent and Trademark Office*